US012754236B2

(12) United States Patent
Ren et al.

(10) Patent No.: US 12,754,236 B2
(45) Date of Patent: Oct. 6, 2026

(54) SYSTEM AND METHOD FOR AREA-EFFICIENT MONITORING OF CLOCK SIGNALS

(71) Applicant: NXP B.V., Eindhoven (NL)

(72) Inventors: Juxiang Ren, Austin, TX (US); Thomas Henry Luedeke, Oberbergkirchen (DE); Loic Leconte, Vence (FR); Parul Bansal, Delhi (IN); Marcus Mueller, Postbauer-Heng (DE)

(73) Assignee: NXP B.V., Eindhoven (NL)

( * ) Notice: Subject to any disclaimer, the term of this patent is extended or adjusted under 35 U.S.C. 154(b) by 105 days.

(21) Appl. No.: 18/809,400

(22) Filed: Aug. 20, 2024

(65) Prior Publication Data

US 2025/0389770 A1 Dec. 25, 2025

(30) Foreign Application Priority Data

Jun. 21, 2024 (IN) ............................ 202441047721

(51) Int. Cl.
*G01R 31/317* (2006.01)
*G06F 1/08* (2006.01)

(52) U.S. Cl.
CPC ......... *G01R 31/31726* (2013.01); *G06F 1/08* (2013.01)

(58) Field of Classification Search
CPC ........ G01R 31/31726; G01R 31/31727; G06F 1/08
See application file for complete search history.

(56) References Cited

U.S. PATENT DOCUMENTS 5,561,390 A * 10/1996 Hiiragizawa ......... H03L 7/0802 327/147
5,642,069 A * 6/1997 Waite .................. G06F 11/0751 714/E11.002
6,121,849 A * 9/2000 McCollough ......... H03L 7/0807 331/34

(Continued)

FOREIGN PATENT DOCUMENTS

CN 102497200 A 6/2012
CN 115021727 A 9/2022

(Continued)

OTHER PUBLICATIONS

Lv et al., "A Loss of Reference Clock Detect Circuit," 2009 IEEE Circuits and Systems International Conference on Testing and Diagnosis, 2009, 4 pages.

(Continued)

*Primary Examiner* — Faisal M Zaman

(57) ABSTRACT

A system and method for detecting a loss of clock signal condition is presented. In various embodiments, a reference clock signal by a clock monitoring system. A toggle signal is generated using the reference clock signal and a clock detector output signal is generated. The clock detector output signal is equal to the toggle signal when a monitored clock signal is received. The clock detector output signal to the toggle signal and, when the clock detector output signal is not equal to toggle signal, an output signal indicative of a loss of clock signal condition is generated. In various embodiments, the clock monitoring system is utilized in conjunction with various systems, including automotive controllers, and the like.

20 Claims, 5 Drawing Sheets

(56) References Cited

U.S. PATENT DOCUMENTS

| | | | | |
|---|---|---|---|---|
| 6,222,392 | B1 * | 4/2001 | Guo | H04J 3/0688 327/198 |
| 6,668,334 | B1 * | 12/2003 | Abel | H03K 5/19 713/502 |
| 6,674,332 | B1 * | 1/2004 | Wunner | H03L 7/235 331/25 |
| 7,334,149 | B1 * | 2/2008 | Wu | G06F 1/08 375/130 |
| 7,818,526 | B2 * | 10/2010 | Jang | G11C 29/02 365/201 |
| 7,944,261 | B1 * | 5/2011 | Lynch | H03L 7/08 327/146 |
| 8,350,596 | B1 * | 1/2013 | Soh | H03K 19/00346 327/20 |
| 8,937,496 | B1 | 1/2015 | Ahmad et al. | |
| 10,761,558 | B1 * | 9/2020 | Hao | G01R 31/31727 |
| 12,259,747 | B1 * | 3/2025 | Thekkeettil | G06F 1/12 |
| 12,261,609 | B1 * | 3/2025 | Sridharan | H03L 7/087 |
| 2005/0213400 | A1 * | 9/2005 | Kim | G11C 29/50012 365/194 |
| 2011/0102092 | A1 * | 5/2011 | Raita | H03K 3/0315 327/156 |
| 2011/0231723 | A1 * | 9/2011 | Lee | G06F 11/24 714/E11.155 |
| 2013/0219238 | A1 * | 8/2013 | Tekumalla | G01R 31/318552 714/E11.155 |
| 2015/0033101 | A1 | 1/2015 | Chebruch et al. | |
| 2015/0200652 | A1 * | 7/2015 | Berzins | H03K 3/0372 327/225 |
| 2016/0118140 | A1 * | 4/2016 | Tsujihashi | G11C 7/065 365/207 |
| 2016/0299806 | A1 | 10/2016 | Warriner et al. | |
| 2019/0041440 | A1 * | 2/2019 | Duggal | G01R 23/15 |
| 2019/0372561 | A1 * | 12/2019 | Tt | H03K 5/19 |
| 2020/0202968 | A1 * | 6/2020 | Ishii | G11C 29/12015 |
| 2022/0091186 | A1 * | 3/2022 | Durga | G06F 1/10 |
| 2024/0288478 | A1 * | 8/2024 | Barcella | H03K 5/19 |
| 2025/0389770 | A1 * | 12/2025 | Ren | G01R 31/31726 |

FOREIGN PATENT DOCUMENTS

| | | | |
|---|---|---|---|
| CN | 111913100 | B | 7/2023 |
| DE | 102012209971 | B | 5/2013 |
| EP | 3971594 | A1 | 3/2022 |

OTHER PUBLICATIONS

Kim et al., "Low Power Continuous-time Equalizer Adopting a Clock Loss Tracking Technique for Digital Display Interface (DDI)," 2008 Digest of Technical Papers—International Conference on Consumer Electronics, 2008, 2 pages.

* cited by examiner

SYSTEM AND METHOD FOR AREA-EFFICIENT MONITORING OF CLOCK SIGNALS

CROSS-REFERENCE TO RELATED APPLICATIONS

This application claims the priority under 35 U.S.C. § 119 of India Patent application no. 202441047721, filed on 21 Jun. 2024, the contents of which are incorporated by reference herein.

FIELD OF THE DISCLOSURE

The present invention generally relates to data processing systems and, more specifically, to data processing systems configured to monitor system clock operations.

BACKGROUND

Most integrated circuits of sufficient complexity (e.g., microprocessor, microcontroller, system-on-chip ("SoC"), etc.) utilize multiple clock signals in order to synchronize different parts of the circuit. Within such integrated circuits, there are one or more processor cores and other blocks (a block, also referred to as an Intellectual Property (IP) block, refers to a reusable unit of logic), each requiring a reliable clock signal in order to properly function and to interact with each other. These various logic circuits or blocks require that their respective clock signals operate at a particular operating frequency within a defined range of frequencies above and below an intended clock frequency (hereinafter referred to as the "specified frequency range"). However, circuitry within the integrated circuits that generates clock signals and the networks that distribute those clock signals to other system components are subject to error conditions (e.g., single-point faults, circuit corruption, or various environmental conditions) that result in a variance of the clock frequency outside of a specified frequency range or complete loss of clock signal. A failure of a clock signal to operate within a specified frequency range results in improper functioning of the particular logic circuitry or even the entire integrated circuit that relies upon that clock signal.

This can be especially important when integrated circuits are implemented within applications where there are safety concerns. For example, many microcontrollers and system-on-chips (SoCs) utilized within automotive vehicles function to perform such critical applications, which may include monitoring the distances between the vehicle and other objects or vehicles, maintaining the vehicle within a driving lane, and collision avoidance (e.g., braking the vehicle before a collision occurs).

As such, manufacturers of automotive microcontrollers and SoCs implement clock monitoring units (CMUs) to monitor each of one or more clock signals delivered to particular logic circuitry within the integrated circuit. The CMUs are configured to detect loss of clock signals or a clock signal operating outside of a specified frequency range. Such CMUs may serve to measure the frequency of an internal oscillator, monitor an external oscillator clock, and/or monitor a selected clock signal within the integrated circuit. A CMU is required to constantly monitor the health of a circuit's clock signals to detect faults.

Although effective, in a system that includes multiple different blocks that rely on independent clock signals, it is not convenient to implement multiple CMUs to monitor and detect faults in the clock signal being supplied to each block. CMUs occupy a relatively large surface area within an SoC making it undesirable to incorporate multiple CMU's within the same SoC.

SUMMARY

This Summary section is neither intended to be, nor should be, construed as being representative of the full extent and scope of the present disclosure. Additional benefits, features and embodiments of the present disclosure are set forth in the attached figures and in the description hereinbelow, and as described by the claims. Accordingly, it should be understood that this Summary section may not contain all of the aspects and embodiments claimed herein.

Additionally, the disclosure herein is not meant to be limiting or restrictive in any manner. Moreover, the present disclosure is intended to provide an understanding to those of ordinary skill in the art of one or more representative embodiments supporting the claims. Thus, it is important that the claims be regarded as having a scope including constructions of various features of the present disclosure insofar as they do not depart from the scope of the methods and apparatuses consistent with the present disclosure (including the originally filed claims). Moreover, the present disclosure is intended to encompass and include obvious improvements and modifications of the present disclosure.

In some aspects, the techniques described herein relate to an integrated circuit, including: logic circuitry configured to perform a function within the integrated circuit; a monitored clock source configured to provide a monitored clock signal to the logic circuitry, wherein the monitored clock source is predetermined to output the monitored clock signal at a specified operating frequency; a reference clock source configured to generate a reference clock signal; and a clock monitoring system, including: a toggle signal generator configured to generate a toggle signal using the reference clock signal, a clock signal detector coupled to the toggle signal generator and the monitored clock source, wherein the clock signal detector is configured to generate an output signal equal to the toggle signal when the monitored clock signal is present at an input to the clock signal detector; and a loss of clock detector coupled to the toggle signal generator and the clock signal detector, wherein the loss of clock detector is configured to: compare the output signal of the clock signal detector to the toggle signal; and when the output signal of the clock signal detector is not equal to the toggle signal, generate an output signal indicative of a loss of clock signal condition.

In some aspects, the techniques described herein relate to a clock monitoring system, including: a first input configured to receive a monitored clock signal; a window duration memory unit configured to store a value determining an evaluation window duration; a second input configured to receive a reference clock signal; a toggle signal generator configured to use to evaluation window duration to generate a toggle signal using the reference clock signal, a clock signal detector coupled to the toggle signal generator and the monitored clock source, wherein the clock signal detector is configured to generate an output signal equal to the toggle signal when the monitored clock signal is present at an input to the clock signal detector; and a loss of clock detector coupled to the toggle signal generator and the clock signal detector, wherein the loss of clock detector is configured to: compare the output signal of the clock signal detector to the toggle signal; and when the output signal of the clock signal detector is not equal to toggle signal, generate an output signal indicative of a loss of clock signal condition.

In some aspects, the techniques described herein relate to a method, including: receiving a reference clock signal; generating a toggle signal using the reference clock signal; generating a clock detector output signal equal to the toggle signal when a monitored clock signal is received; comparing the clock detector output signal to the toggle signal; and when the clock detector output signal is not equal to toggle signal, generating an output signal indicative of a loss of clock signal condition.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

The present invention generally relates to data processing systems and, more specifically, to data processing systems configured to monitor system clock operations.

Embodiments of the present disclosure provide for an area-efficient approach for monitoring and detecting faults in multiple clock signals within an integrated circuit that may result in loss-of-clock conditions. Embodiments of the present disclosure enable a single clock monitoring unit (CMU) to detect faults in multiple different clock signals operating at the same or different operating frequencies using a number of clock signal probes or sensors that can be distributed through an integrated circuit to monitor clock signal inputs to multiple different processor cores and other circuit blocks.

As described herein, the present disclosure further provides a clock monitoring system that incorporates a "fault injection" capability in which the conditions for an artificial clock signal fault can be generated to confirm that the fault detection system is operating correctly. This fault injection mode can be further utilized to test a particular system's clock signal fault recovery operations.

Figure 1:
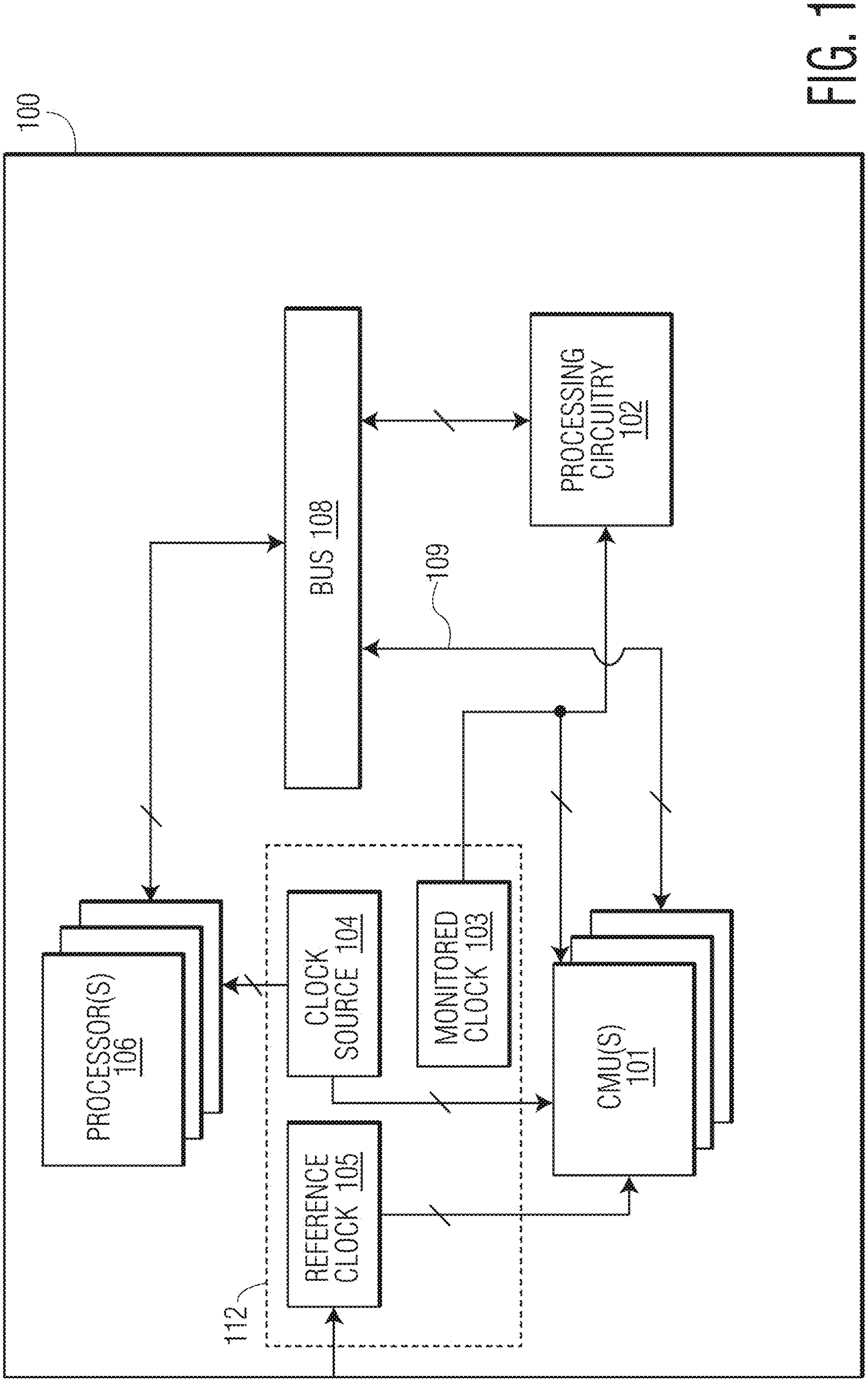
FIG. 1 illustrates an exemplary integrated circuit that includes a CMU configured to detect clock signal faults.

FIG. 1 illustrates an exemplary integrated circuit 100 that includes a CMU configured to detect clock signal faults. The integrated circuit 100 may be a microprocessor, microcontroller, system-on-chip ("SoC"), or any integrated circuitry using one or more clock signals. The integrated circuit 100 may find use in a large number of possible applications. For example, the integrated circuit 100 may be used in any applications that require a high degree of accuracy and/or safety including, but not limited to, automotive microcontrollers, flight system controllers, communication systems, medical applications, or other applications involving processor devices or other devices that use clock signals. In an example use case, integrated circuit 100 may form part of a vehicle-control system, such as by implementing a signal processing capability of an automotive radar system, or other advanced driver assistance system.

The integrated circuit 100 includes clock generation circuitry 112, which may include one or more clock sources and/or a clock divider network (not shown) configured in any suitable well-known manner for generating one or more clock signals that can be used by one or more other components of the integrated circuit 100. In embodiments, clock generation circuitry 112 may be configured to output multiple clock signals of different frequencies, where the various frequencies are whole number multiples of one another. For example, clock generation circuitry 112 may output a first clock signals having a frequency $f_{clock}$, and multiple other clock signals having frequencies of $f_{clock}/2$, $f_{clock}/4$, etc.

In the non-limiting exemplary embodiment illustrated in FIG. 1, clock generation circuitry 112 may include a reference clock source 105 generating a reference clock signal. The reference clock signal generated by reference clock 105 may be generated from a source external to the integrated circuit 100, such as an external crystal oscillator (not shown) or may originate from another integrated circuit (not shown).

The clock generation circuitry 112 may further include a clock source 104 that generates an operating clock signal for use by various circuitry (e.g., processor cores, digital signal processors, field programmable gate arrays, application specific integrated circuits, discrete logic circuits, general circuit blocks, etc., all of which are generally designated as processor(s) 106 in FIG. 1) within the integrated circuit 100 that communicate with each other over a system bus 108.

The clock source 104 may generate the operating clock signal from a node within a clock divider network of the clock generation circuitry 112. The integrated circuit 100 may include any number of such clock sources having predetermined specified operating frequencies, as discussed above. The monitored clock 103 is a clock source that may also be generated from a node within a clock divider network of the clock generation circuitry 112. The operating clock signal generated by the clock source 104 and the monitored clock 103 are separately generated clock signals within the clock generation circuitry 112. The operating clock signal generated by clock source 104 and monitored clock 103 may be generated within the clock generation circuitry from the reference clock 105.

In the example shown in FIG. 1, the monitored clock signal generated by monitored clock 103 is supplied to processing circuitry 102. Processing circuitry 102 may include any suitable logic device(s), such as one or more processor cores, digital signal processors, field programmable gate arrays, application specific integrated circuits, or discrete logic circuits, etc., which performs operations using the monitored clock signal generated by monitored clock 103.

In the conventional configuration, integrated circuit 100 includes several clock monitor units ("CMUs") 101 that are implemented in the integrated circuit 100 to monitor the current operating frequency of clock signals generated by the clock sources of integrated circuit 100 (e.g., clock source 104, monitored clock 103, and reference clock 105), and to output signals indicating whether the monitored clock signals are operating within a specified frequency range. For purposes of describing exemplary embodiments of the present disclosure, a CMU 101 is configured to monitor and evaluate the clock signals generated by monitored clock 103 provided to the processing circuitry 102.

A CMU 101 could be configured to monitor the clock signal by receiving the current clock signal generated by monitored clock 103, counting a number of pulses in the monitored clock signal during a specified time period (e.g., as measured by another clock signal), and comparing the counted number of pulses to one or more thresholds (such as thresholds defining the boundaries of a range of acceptable count values representing a specified frequency range of the monitored clock 103). If the counted number of clock signal pulses fails to satisfy either of the thresholds, CMU 101 may be designed to determine that an error in the clock signal has been detected (i.e., operating outside of the specified frequency range), and take suitable action (e.g., outputting a clock fail signal).

In conventional integrated circuit 100 implementations, a different CMU 101 is provided for each clock signal being monitored. However, CMUs 101 are complicated circuits and can require a significant amount of circuit area to implement. As such, in an integrated circuit 100 with multiple clock signals that require monitoring, a significant amount of the area of integrated circuit 100 will be occupied by the multiple CMUs. Given the ever-present need to reduce surface area of integrated circuits 100, the conventional use of multiple CMUs to monitor clock signals is an area-inefficient approach.

As such, the present disclosure provides an area-efficient system for detecting a loss or error in the clock signals of one or more clock nodes and reporting such a fault. The present approach also enables software control of this capability and the ability to monitor clock signals without the need for multiple CMU instances.

Figure 2:
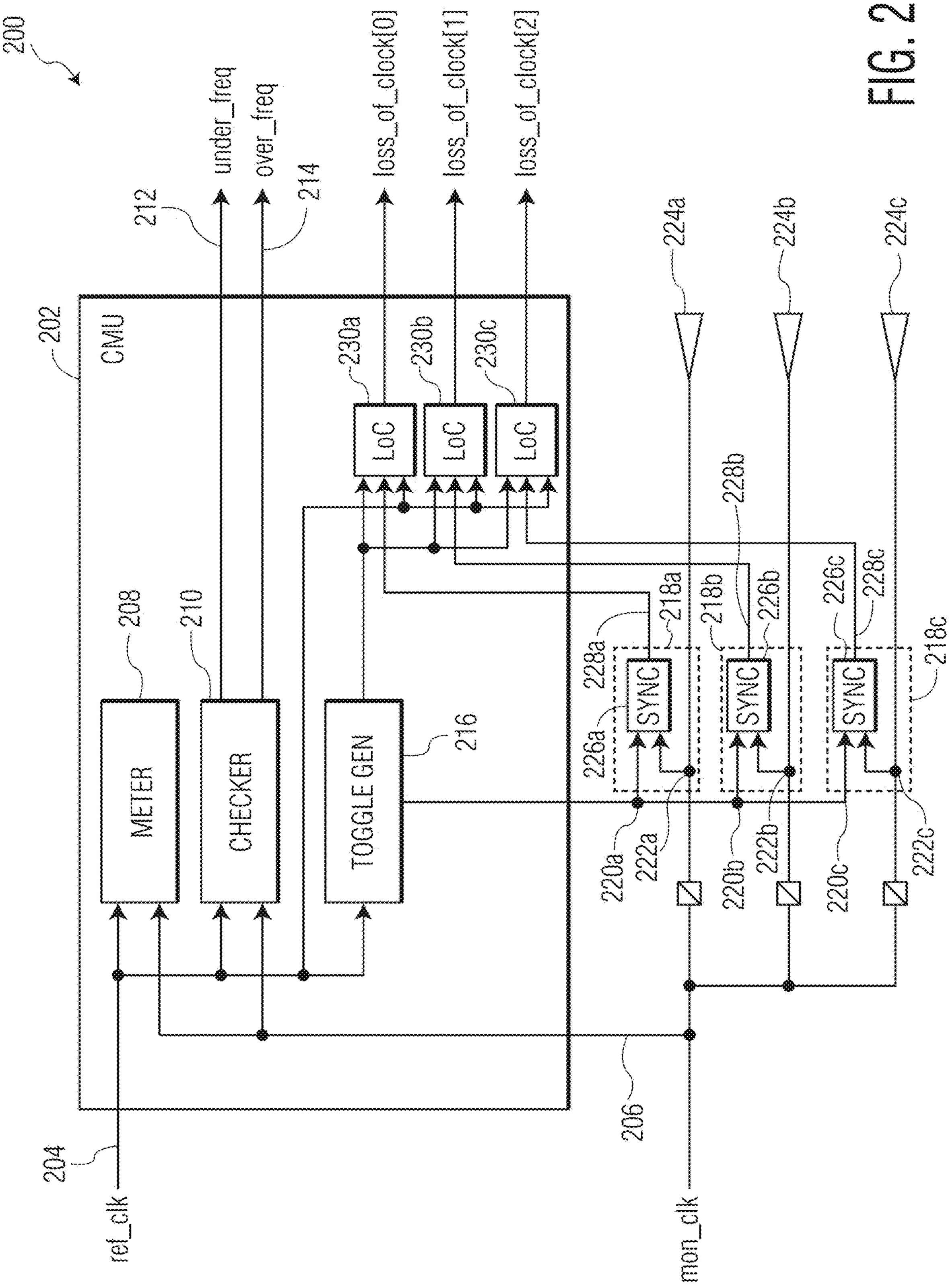
FIG. 2 is a block diagram illustrating a clock monitoring system that includes a plurality of clock monitoring unit configured to detect out-of-sync clock errors and loss of clock signal at a number of different cores or blocks of an integrated circuit.

In accordance with the present disclosure, FIG. 2 is a block diagram illustrating a clock monitoring system 200 that include a plurality of clock monitoring unit configured to detect out-of-sync clock errors and loss of clock signal at a number of different cores or blocks of an integrated circuit. Clock monitoring system 200 may be implemented, for example, in conjunction with integrated circuit 100 of FIG. 1 to replace a conventional CMU 101 to enable monitoring of clock signals being supplied to number of different processor blocks (e.g., processor(s) 106) of FIG. 1 with reduced surface area requirements. As such, clock monitoring system 200 may be implemented as part of a microprocessor, microcontroller, system-on-chip ("SoC"), or any other integrated circuitry having components that utilize one or more clock signals. Clock monitoring system 200 may find use in a large number of possible applications. For example, clock monitoring system 200 may be used in any applications that require a high degree of accuracy and/or safety including, but not limited to, automotive microcontrollers, flight system controllers, communication systems, medical applications, or other applications involving processor devices or other devices that use clock signals. In an example use case, clock monitoring system 200 may form part of a vehicle-control system, such as by implementing a signal processing capability of an automotive radar system, or other advanced driver assistance system.

Clock monitoring system 200 includes CMU 202. CMU 202 includes input 204 configured to receive a reference clock signal ref_clk (e.g., from reference clock 105 of FIG. 1). As described herein, CMU 202 is configured to use the reference clock signal to monitor a single system-wide clock signal mon_clk. As such, CMU 202 includes input 206 configured to receive the monitored clock signal mon_clk.

CMU 202 may include an optional meter function 208, which is a circuit that receives as inputs the reference clock signal ref_clk and the monitored clock signal mon_clk. Meter 208 is configured to compare the two input clock signals to determine their average frequencies over a particular predefined time window. These average frequency measurements can be utilized by CMU 202 to detect clock signal errors.

CMU 202 further includes a checker function 210, which is a logical circuit configured to compare the frequency of the monitored clock signal mon_clk to the frequency of the reference clock signal ref_clk to determine whether the frequency of the monitored clock signal is with a threshold amount of the frequency of the reference clock signal. If the frequency of the monitored clock signal is within the threshold, checker function 210 may determine that the monitored clock signal is within specification and no output signal is generated. If, however, checker function 210 determines that the frequency of the monitored clock signal falls below the frequency of the reference clock signal by a threshold amount, checker function 210 generates an output signal at output 212 indicative of that under-frequency condition. Similarly, if checker function 210 determines that the frequency of the monitored clock signal falls above the frequency of the reference clock signal by a threshold amount (which could be the same or different as the threshold used to check the under-frequency condition), checker function 210 generates an output signal at output 214 indicative of that over-frequency condition. Checker function 210 may use any suitable approach for comparing the frequencies of the reference and monitored clock signals.

In order to determine the under or over-frequency condition, checker function 210 must sample both the reference clock signal and the monitored clock signal over a substantial period of time, (generally at least twice as long as the evaluation window discussed below before an issue can be detected. For example, checker function 210 may be required to count a large number of pulses of both the reference and clock signals to determine whether the number of pulses counted (which is indicative of frequency) of both signals are within a threshold value of one another. It may require a substantial amount of time to count the necessary number of pulses of each signal in order to make the comparison accurately.

In various embodiments of clock monitoring system 200, optional meter function 208 and checker function 210 are only configured to monitor and detect issues with a single reference clock signal. As such, if different clock signals being supplied to different components of a larger system are to be monitored, a CMU configuration that only includes optional meter function 208 and checker function 210 (e.g., as in conventional CMU circuits) would have to be replicated at multiple locations within the larger system, with one CMU being implemented for each clock signal being monitored. This approach, however, can consume significant surface area within the system and a relatively long detection time for low-of-clock conditions, and does not provide an efficient approach for monitoring multiple different clock signals.

To remedy this difficulty, clock monitoring system 200 includes additional novel components to perform loss of clock detection for multiple clock signals. Specifically, clock monitoring system 200 includes toggle signal generator 216. Toggle signal generator 216 receives the reference clock signal ref_clk as an input and is configured to generate an output toggle signal based on the reference clock signal. Specifically, the toggle signal output by toggle signal generator 216 is configured to toggle between low (e.g., a low voltage or Boolean '0' value) and high (e.g., a high voltage or Boolean '1' value) values at a frequency determined by an evaluation window duration value. Typically, the evaluation window duration value can be expressed as a number of reference clock cycles that is greater than the duration of two monitored clock cycles, plus any time required for synchronization back into the reference clock signal domain.

In various embodiments, as depicted in FIG. 2, toggle signal generator 216 may be implemented as part of or integrated into CMU 202. In other embodiments, however, toggle signal generator 216 may be implemented as a logical circuit that is separate or distinct from CMU 202 of clock monitoring system 200.

Clock monitoring system 200 is configured to monitor the clock signals being transmitted to a number of processors 224*a*, 224*b*, and 224*c* (e.g., processor cores, digital signal processors, field programmable gate arrays, application specific integrated circuits, discrete logic circuits, general circuit blocks, etc., all of which are generally designated as processors herein). Accordingly, with reference to FIG. 2, clock monitoring system 200 includes clock signal detectors 218 (specifically, clock signal detectors 218*a*, 218*b*, and 218*c*) which are connected to the clock signal lines being supplied to each one of the processors 224 being monitored and operate as probes or sensors to detect clock signals. Although FIG. 2 shows an implementation of CMU 202 having three processors 224 and corresponding clock signal detectors 218, it should be understood that clock monitoring system 200 could be implemented with fewer (e.g., one or two) or more (e.g., four or more) clock signal detectors 218 depending upon the number of independent clock signals to be monitored and, possibly, the number of processors 224 within the system.

Each clock signal detector 218 includes an input 220 (specifically, inputs 220*a*, 220*b*, and 220*c*) configured to receive the toggle signal output by toggle signal generator 216. Additionally, each clock signal detector 218 includes an input 222 (specifically, inputs 222*a*, 222*b*, and 222*c*) configured to receive the clock signal to be monitored (e.g., mon_clk).

Each clock signal detectors 218 includes a synchronizer 226 (specifically, synchronizers 226*a*, 226*b*, and 226*c*) configured to receive the toggle and monitored clock signals at inputs 220 and 222, respectively.

Synchronizers 226 are configured to generate output signals at their respective output terminals 228 (specifically, output terminals 228*a*, 228*b*, and 228*c*) based upon the two input signals to each synchronizer 226. Specifically, synchronizers 226 are configured so that when a valid clock signal is present at inputs 222, synchronizers store the value of the toggle signal at inputs 220 and output that stored toggle signal value at synchronizer 226 outputs terminals 228.

As such, in this configuration, if proper clock signals are correct at the synchronizer's input, clock signal detectors 218 will generate output signals that are equal to the current value of the toggle signal. If no clock signal is present, clock signal detectors 218 will output a stale and incorrect version of the toggle signal.

The outputs of synchronizers 226 are provided to respective loss of clock detectors 230 (specifically, loss of clock detectors 230*a*, 230*b*, and 230*c*). Loss of clock detectors 230 are configured to receive as inputs the output signals of their respective clock signal detectors 218, the toggle signal generated by toggle signal generator 216, and the reference clock signal. Loss of clock detectors 230 are configured to use those input signals (details of how the signals are utilized are provided, below, with respect to FIG. 4) to determine whether the outputs being generated by each clock signal detector 218 indicates the presence or loss of a clock signal. As such, each clock detector 230 is configured to generate, for each clock signal detectors 218 an indication of whether a clock signal is present. If a loss of clock signal is detected, the output signal indicating that condition can be utilized by the system (e.g., integrated circuit 100 of FIG. 1) to take appropriate action to mitigate the consequences of the corresponding processor 224 being without a proper clock signal.

To summarize the operation of clock monitoring system 200, the toggle signal, which changes state between a low and a high value with every evaluation window, is supplied to each one of the clock signal detectors 218. If the clock signal detectors 218 are receiving a valid monitored clock signal, the synchronizer 226 in each clock signal detectors 218 will process the received toggle signal and output the value of that signal to the synchronizer's 226 corresponding clock detector 230. If the clock detectors 230 detect that within each evaluation window, the outputs of their respective clock signal detectors 218 toggles between a low value and a high value (either transitioning from the low value to the high value or vice versa) that corresponds to the current toggle signal value, that indicates a valid clock signal is being received at the corresponding clock signal detectors 218 and no loss of clock is detected.

If, however, during an evaluation window, the output of a particular clock signal detectors 218 does not toggle between low and high values in accordance with the toggle signal, that indicates that the sync block in that particular detector 218 is not receiving a valid clock signal and, as a result, has not synchronized the toggle signal input to the output of the detector 218. That failure of the output of the detector 218 to change value within the evaluation window indicates that no valid clock signal is present for that detector 218 and the corresponding clock detectors 230 can generate a loss of clock signal output accordingly.

In this configuration, therefore, a loss of clock signal can be detected for a particular processors 224 within a single evaluation window, which may not be possible in conventional CMUs, which may require time periods that extend beyond multiple evaluation windows before a clock signal fault can be detected.

In some systems, different processors (e.g., processors 224) may be supplied clock signals of different frequencies. In that case, the clock signal detectors 218 can be configured to detect the loss of clock signals, even when those signals are at different frequencies without any substantial modification. The only constraint is that the duration of the applicable evaluation window must be greater than the period of the lowest-frequency clock signal being detected.

Figure 3:
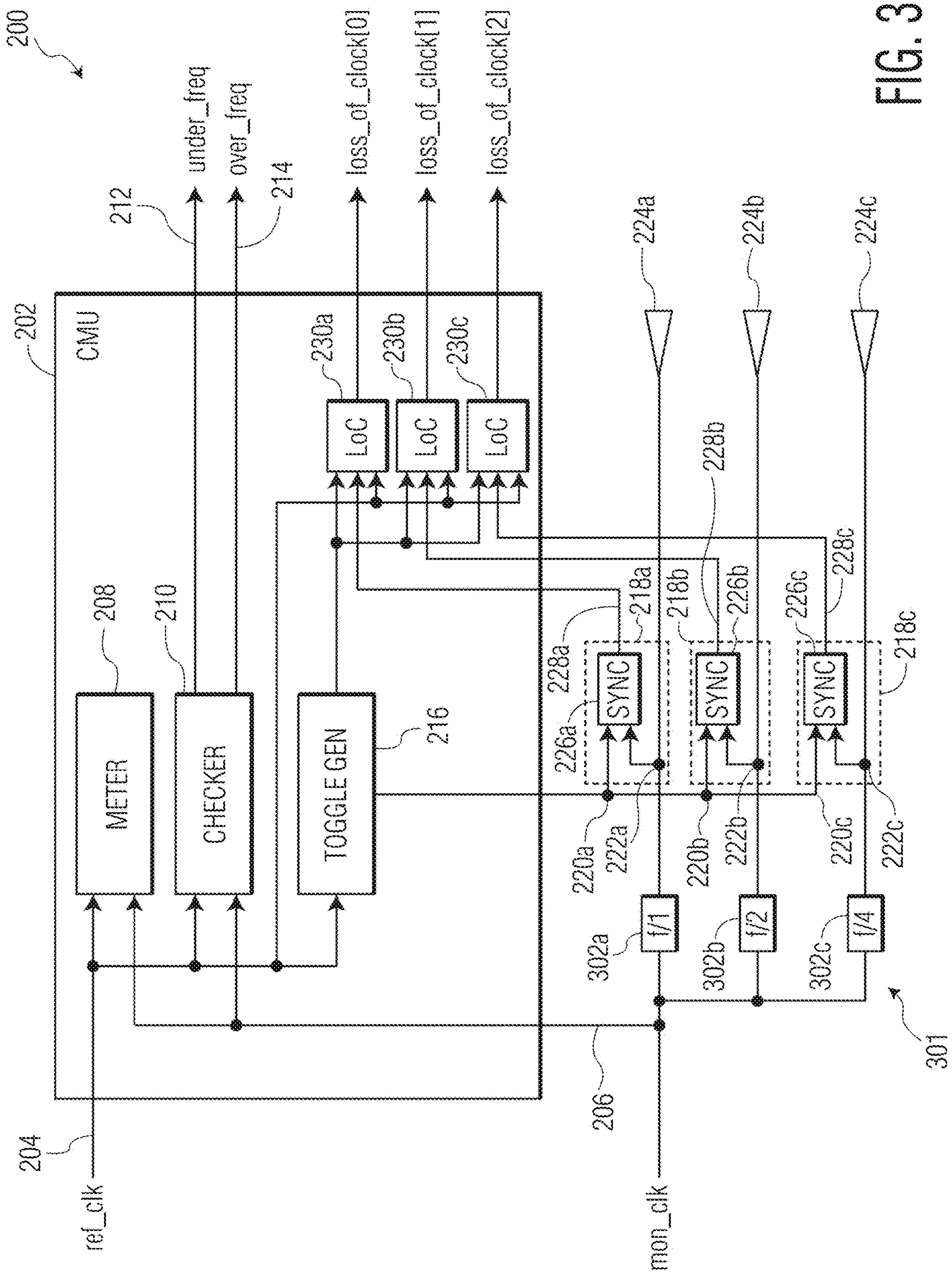
FIG. 3 show an implementation of a CMU having three processors and corresponding clock signal detectors.

To illustrate, FIG. 3 depicts a modification to clock monitoring system 200 of FIG. 2 in which the clock signals being monitored may be oscillating at reduced frequencies as part of a clock divider network 301. As depicted in FIG. 3, each monitored clock signal passes through a frequency divider 302*a*, 302*b*, and 302*c*, which may be configured to modify a frequency of the input clock signal. In this embodiment, frequency divider 302*a* does not modify a frequency of its input clock signal, frequency divider 302*b* reduces the frequency of its input clock signal by half, and frequency divider 302*b* reduces the frequency of its input clock signal by a factor of four.

Each of those clock signals can be processed in the same manner by their respective clock signal detectors 218 to determine whether a valid clock signal is present (even if the clock signal is at a reduced frequency). The only constraint, as mentioned above, is that the period of the reduced-frequency clock signal cannot exceed the evaluation window of the clock signal detectors 218 configured to detect that clock signal. This ensures that if the clock signal is present, the toggle signal will be captured by the clock signal detector 218 and output to the respective clock detectors 230 as an indication of a valid clock signal.

Both optional meter function 208 and checker function 210 perform analysis of the input monitored and reference clock signals at a common node of the system's clock tree before any signal gating is applied to generate clock signals of different frequencies. That is, both optional meter function 208 and checker function 210 only perform an analysis of the raw clock signals as they are generated by the system's clock generation circuit (e.g., clock generation circuitry 112 of FIG. 1). According, in conventional approaches, neither optional meter function 208 nor checker function 210 perform any analysis of or determine correct operation of any clocks further down the clock branch at the point that clock signals are supplied to various system components or processors. As such, neither optional meter function 208 nor checker function 210 would detect a loss of clock signals should that loss occur directly at the input to a system components or processor. These components only monitor the direct output of the system's clock generation circuit.

Figure 4:
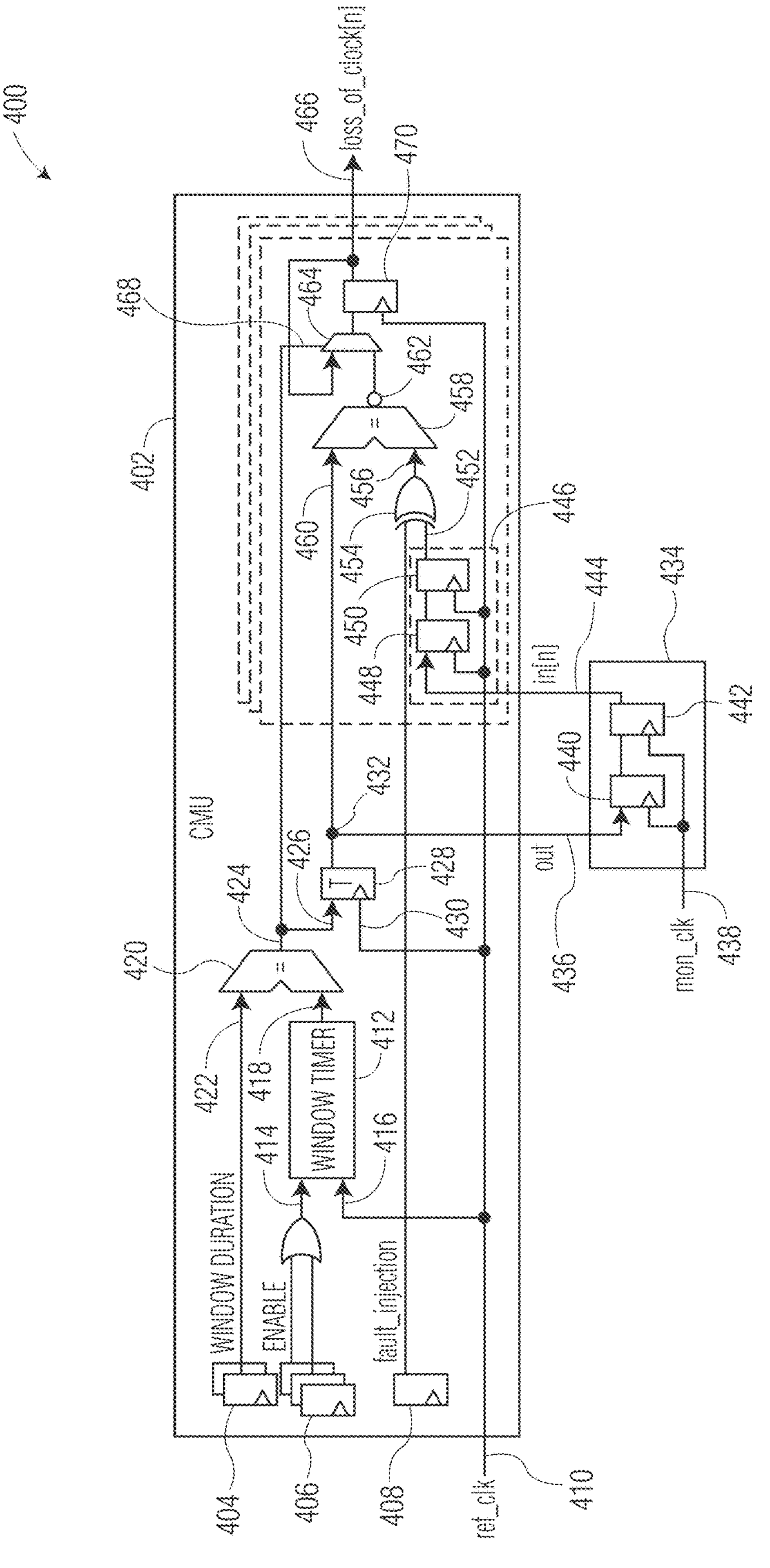
FIG. 4 is a block diagram depicting the functional components of a clock monitoring system configured to detect a loss-of-clock condition in accordance with the present disclosure.
Figure 5:
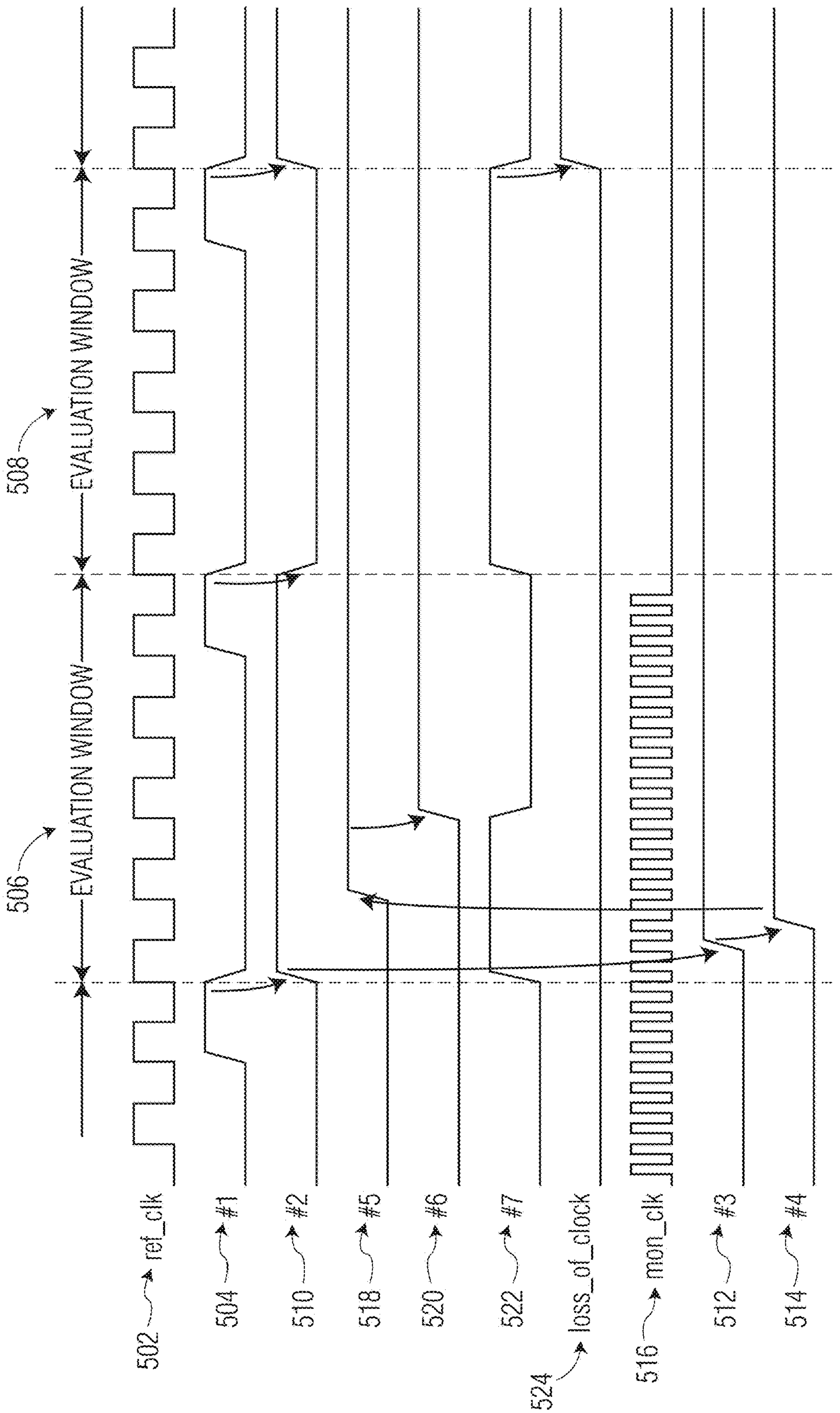
FIG. 5 is a chart depicting a number of traces that represent the outputs of various components of a clock monitoring system during clock monitoring operations.

FIG. 4 is a block diagram depicting the functional components of clock monitoring system 400 configured in accordance with the present disclosure. FIG. 5 is a chart depicting a number of traces that represent the outputs of various components of clock monitoring system 400 during clock monitoring operations.

Clock monitoring system 400 includes CMU 402 (e.g., CMU 202 of FIGS. 2 and 3). CMU 402 includes memory components configured to store predefined values used by CMU 402 to perform clock detection, as described herein.

Specifically, CMU 402 includes window duration memory unit 404 configured to store a value indicative of the evaluation window duration used by CMU 402. The evaluation window duration value is used by CMU 402 to generate the toggle signal (described below). Typically, the evaluation window value is expressed as a number of reference clock cycles that is equal to or greater than two monitored clock cycle period plus two reference clock periods.

CMU 402 includes an enable memory unit 406 configured to store a value that determines whether CMU 402 is operative. Enable memory unit 406 may store multiple enable values, one for each clock signal being monitored by clock monitoring system 400. As such, monitoring may be enabled or disabled separately for each monitored clock signal received by clock monitoring system 400. As such, various clock branches may be turned on or off separately depending on application needs. If, for example, a particular application were to turn off a single clock branch, the monitoring of the associated clock signal could be disabled for only that particular branch.

Fault injection unit 408 stores a value indicative of whether an artificial clock fault is being injected into CMU 402. If the fault injection value has a low value, no artificial fault is being injected and CMU 402 operates normally. If, however, the fault injection value has a high value an artificial fault is generated. As described herein, by injecting an artificial clock fault into CMU 402, CMU 402 will output a loss of clock signal enabled testing of loss of clock error recovery processes within the system in which CMU 402 is operating.

At input terminal 410, CMU 402 receives a reference clock signal. The reference clock signal can be generated by an external reference clock signal generator (e.g., reference clock source 105 of FIG. 1).

CMU 402 includes window timer 412, which is configured to generate an output signal that is a simple counter that increments on each reference clock signal (e.g., received at input terminal 410) pulse. The output of window timer 412 is the counter value. If the counter value is equal to the window duration value (as determined by comparator 420), the counter starts counting again from the beginning and comparator 420 issues a pulse that will cause the output of flip-flop 428 to toggle and the output of comparator 458 to be latched by latch 470. To enable its operation, window timer 412 includes input 414 configured to receive the enable signal value to determine whether CMU 402 is operational and input 416 configured to receive the reference clock signal from input terminal 410 of CMU 402.

Window timer 412 is configured to generate an output signal when the enable signal received at input 414 indicates CMU 402 is operational.

The output of window timer 412 is supplied to input 418 of comparator 420. Input 422 of comparator 420 receives the window duration value from window duration memory unit 404. During operation, the output of 420 at terminal 424 is a low value if the two inputs received at input 422 and input 418 are different, and a high value if the two inputs have the same value. Given this operation, the output of comparator 420 will be a low value at all times except when the value received from window timer 412 matches the window duration value received from window duration memory unit 404. As such, comparator 420 outputs high value pulses at a frequency determined by the window duration value stored in window duration memory unit 404. Each pulse generated by comparator 420, therefore, can define the beginning each evaluation window of CMU 202. These pulses are depicted in FIG. 5

Specifically, in FIG. 5, waveform 502 represents the reference clock signal that is being received at input terminal 410 of CMU 402. As depicted, the waveform is made up of a series of pulses. Given that reference signal and a predetermined evaluation window duration value (e.g., stored in window duration memory unit 404), comparator 420 will output a series of pulses that define the beginning of a particular evaluation window for performing clock loss detection. The output of comparator 420 is depicted in FIG. 5 by waveform 504, which, as depicted, includes pulses that define the beginning of each evaluation window. FIG. 5 shows waveform for evaluation window 506 and evaluation window 508.

Returning to FIG. 4, the output pulses of comparator 420 are provided to input terminal 426 of toggle flip-flop 428. Input terminal 430 of toggle 428 receives the reference clock signal. Flip-flop 428 is configured so that each time the input at terminal 426 switches to a high value (i.e., each time a new pulse is received from comparator 420) the output of flip-flop 428 toggles between high and low values. As such, in this configuration, the output of flip-flop 428 at output terminal 432 toggles between high and low values in each evaluation window. In FIG. 5, waveform 510 represents the output of flip-flop 428. As shown the output is high during evaluation window 506 and toggles to a low value during the next evaluation window 508. The output of flip-flop 428 is the "toggle signal" described above and output by toggle signal generator 216 of FIGS. 2 and 3. As such, window timer 412 comparator 420, and flip-flop 428 together provide the functionality of toggle signal generator 216 of FIGS. 2 and 3.

The toggle signal is output to clock signal detector 434 (e.g., clock signal detectors 218 of FIGS. 2 and 3). Clock signal detector 434 is separate from CMU 402 and operates as a probe or sensor that can be used to determine whether a particular clock signal in a larger system or IC is present. Although only a single clock signal detector 434 is shown in FIG. 4, it should be understood that clock monitoring system 400 may include multiple clock signal detectors 434. In that case, each of the multiple clock signal detectors would have the same configuration as clock signal detector 434.

Clock signal detector 434 includes input terminal 436 configured to receive the toggle signal and input 438 configured to receive the clock signal being monitored. Clock signal detector 434 include latch 440 and latch 442 (the latches provide the functionality of a synchronizer 226 of FIGS. 2 and 3). Latch 440 receives at its data input terminal the toggle signal. The output of latch 440 is supplied to the data input of latch 442. Each of latch 440 and latch 442 receives at their clock inputs the monitored clock signal.

If the monitored clock signal is present at input 438 of clock signal detector 434, the toggle signal received at input terminal 436 is sequential stored by latch 440 and latch 442 and ultimately output at output terminal 444 of clock signal detector 434. If, however, the monitored clock signal is not present at input 438 (i.e., in the event of a loss of that clock signal), latches 440 and 442 are none operative and the current value of the toggle signal will not be stored by either latch 440 or 442 and will not be output at terminal 444.

In FIG. 5, the output signal of latch 440 is depicted by waveform 512 and the output signal of latch 440 is depicted by waveform 514. As depicted, the output of latch 440 is delayed by one clock cycle with respect to the output of latch 440. The monitored clock signal is represented by waveform 516. As illustrated, in evaluation window 506, when the monitored clock signal is present, latches 440 and 442 sequential store and output the toggle signal (waveform 510). However, in evaluation window 508, as illustrated in FIG. 5, the monitored clock signal (waveform 516) has failed. As a consequence, latches 440 and 442 do not output the current value of the toggle signal (waveform 510).

Returning to FIG. 4, the output of clock signal detector 434 is supplied as an input to synchronizer 446, which comprises latches 448 and 450. Latches 448 and 450 receive at their clock inputs the reference clock signal from input terminal 410. Latches 448 and 450 sequentially store the value output from clock signal detector 434. That value is ultimately output by synchronizer 446 at output terminal 452. Synchronizer 446 to provide stability of clock monitoring system 400 in that latches 448 may go metastable if the output signal of clock signal detector 434 via connection 444 changes state at the same time as the rising edge of the reference clock signals. In that condition, latches 450 operates to clean up this metastability so that the signal output at output terminal 452 is a clean signal. A similar delay is applied to the original toggle signal via the window duration value to account for this operation.

In FIG. 5, the output of latch 448 is depicted by waveform 518 and the output of latch 450 is depicted by waveform 520. As illustrated, the output of latch 450 is delayed by one clock cycle with respect to the output of latch 448.

Returning to FIG. 4, the output of delay element 446 is supplied to an input of exclusive or (XOR) gate 454. A second input of XOR gate 454 receives the fault injection signal output by fault injection unit 408. If the fault injection signal is low (i.e., no artificial fault injection is occurring), XOR gate 454 will output the value received from delay element 446, essentially passing through that value. If, however, the fault injection signal is high (i.e., artificial fault injection is active), XOR gate 454 will output the opposite of the value received from delay element 446 thereby artificially creating a loss of clock condition.

The output of XOR gate 454 is supplied to input 456 of an output inverting comparator 458. Input 460 of comparator 458 receives the original toggle signal from flip-flop 428. If the toggle signal and the output of XOR gate 454 are equal, comparator 458 generates a high value, which is inverted by output terminal 462 to a low value. Conversely, if the toggle signal and the output of XOR gate 454 are different, comparator 458 generates a low value, which is inverted by output terminal 462 to a high value. In FIG. 5 the output of comparator 458 is illustrated by waveform 522.

The output of comparator 458 is supplied at a first input of multiplexer 464. A second input of multiplexer 464 receives the current loss of clock signal from output terminal 466 of CMU 402. Control terminal 468 of multiplexer 464 determines whether multiplexer 464 outputs the signal received from XOR gate 454 (which, if the monitored clock is present, will generally be equal to the toggle signal) or the loss of clock signal received from output terminal 466. Control terminal 468 receives as input the pulse signals from comparator 420 which, as described above, delineate the beginning of every evaluation window. The output of multiplexer 464 is supplied to the data input of latch 470. At its clock input, latch 470 receives the reference clock signal from input terminal 410.

In this configuration, when the signal from comparator 420 has a low value, multiplexer 464 will simply output the loss of clock signal received from output terminal 466 essentially keeping that signal constant, which is stored in latch 470.

However, when the signal at control terminal 468 of multiplexer 464 goes high (i.e., due to comparator 420 outputting a pulse indicative of the beginning of a new evaluation window), multiplexer 464 instead outputs the value received from comparator 458, which is then captured by latch 470. If that value is high (which indicates that the signal received from clock signal detector 434 does not match the toggle signal), that indicates that the monitored clock signal does not include a valid clock signal capable of causing latches 440 and 442 to operate normally. As such, that high value, which is captured by latch 470 and output at output terminal 466 is indicative of a loss of clock condition. Conversely, if the value output by comparator 458 is a low value (which indicates that the signal received from clock signal detector 434 does match the toggle signal), that indicates that the monitored clock signal is operating correctly, and that no loss of clock condition exists. That low value, which is captured by latch 470 and output at output terminal 466, indicates that there is no loss of clock condition.

As such, delay element 446, XOR gate 454, comparator 458, multiplexer 464, and latch 470 implement the functionality of a clock detector 230 of FIGS. 2 and 3.

In FIG. 5, the loss of clock signal generated at output terminal 466 is depicted by waveform 524. As illustrated, in evaluation window 506 during which the monitored clock signal is operating properly (waveform 516), the loss of clock signal is low indicating no clock fault. However, at the conclusion of evaluation window 508 and the beginning of the next evaluation window, during which the monitored clock signal is not operating properly (waveform 516), the loss of clock signal is high indicating a loss of clock fault.

Once a loss of clock has been detected and the signal output at output terminal 466 of CMU 402 goes high, CMU 402 can be reset by toggling the enable value stored in enable memory unit 406 to temporarily disable CMU 402, at which time stored values will reset.

As described above, therefore, during operation CMU 402 of clock monitoring system 400 is generally configured to transmit a toggle signal to one or more clock signal detector 434. If the clock signals being monitored by those detectors is present, the toggle signal will be captured by the latches in the clock signal detector 434 and returned back to CMU 402. If, however, the monitored clock signals are non-operative, the toggle signal will not be returned back to the CMU 402.

Using the signals received from each clock signal detector 434, CMU 402 is configured to determine whether the clock signal detector 434 returns a copy of the toggle signal within the current evaluation window. If so, CMU 402 determines there is no loss of clock signal. If, however, the toggle signal is not returned by the clock signal detector 434 within the current evaluation window, CMU 402 will generate a loss of clock signal indicating that the monitored clock signal is non-operative. The system that incorporates clock monitoring system 400 can then take appropriate action.

As discussed above, because a number of clock signal detectors 434 could be distributed about an integrated to perform loss of clock detection for a number of different system components and processors, the configuration of CMU 402 can reduce the number of CMUs that must be implemented to provide adequate loss of clock detection as compared to conventional approaches that rely on multiple CMUs. As an example, the configuration of clock monitoring system 400 could enable simultaneous loss of clock detection on a number of different branches of a clock signal distribution network.

In some aspects, the techniques described herein relate to an integrated circuit, including: logic circuitry configured to perform a function within the integrated circuit; a monitored clock source configured to provide a monitored clock signal to the logic circuitry, wherein the monitored clock source is predetermined to output the monitored clock signal at a specified operating frequency; a reference clock source configured to generate a reference clock signal; and a clock monitoring system, including: a toggle signal generator configured to generate a toggle signal using the reference clock signal, a clock signal detector coupled to the toggle signal generator and the monitored clock source, wherein the clock signal detector is configured to generate an output signal equal to the toggle signal when the monitored clock signal is present at an input to the clock signal detector; and a loss of clock detector coupled to the toggle signal generator and the clock signal detector, wherein the loss of clock detector is configured to: compare the output signal of the clock signal detector to the toggle signal; and when the output signal of the clock signal detector is not equal to the toggle signal, generate an output signal indicative of a loss of clock signal condition.

In some aspects, the techniques described herein relate to an integrated circuit, wherein the monitored clock source includes a clock divider network.

In some aspects, the techniques described herein relate to an integrated circuit, wherein a frequency of the monitored clock signal is different from a frequency of the reference clock signal.

In some aspects, the techniques described herein relate to an integrated circuit, wherein the clock monitoring system includes a memory storing an evaluation window duration, and the toggle signal is configured to alternate between a high value and a low value at a frequency determined by the evaluation window duration.

In some aspects, the techniques described herein relate to an integrated circuit, wherein the evaluation window duration is determined by the frequency of the monitored clock signal.

In some aspects, the techniques described herein relate to an integrated circuit, wherein the toggle signal generator and the loss of clock detector are implemented within a clock monitoring unit (CMU) and the clock signal detector is external to and is not implemented within the CMU.

In some aspects, the techniques described herein relate to an integrated circuit, wherein the clock signal detector includes a first latch, a data input of the first latch is configured to receive the toggle signal, and a clock input of the first latch is configured to receive the monitored clock signal.

In some aspects, the techniques described herein relate to an integrated circuit, wherein the integrated circuit is an automotive microcontroller.

In some aspects, the techniques described herein relate to a clock monitoring system, including: a first input configured to receive a monitored clock signal; a window duration memory unit configured to store a value determining an evaluation window duration; a second input configured to receive a reference clock signal; a toggle signal generator configured to use to evaluation window duration to generate a toggle signal using the reference clock signal, a clock signal detector coupled to the toggle signal generator and the monitored clock source, wherein the clock signal detector is configured to generate an output signal equal to the toggle signal when the monitored clock signal is present at an input to the clock signal detector; and a loss of clock detector coupled to the toggle signal generator and the clock signal detector, wherein the loss of clock detector is configured to: compare the output signal of the clock signal detector to the toggle signal; and when the output signal of the clock signal detector is not equal to toggle signal, generate an output signal indicative of a loss of clock signal condition.

In some aspects, the techniques described herein relate to a clock monitoring system, wherein the monitored clock source includes a clock divider network.

In some aspects, the techniques described herein relate to a clock monitoring system, wherein a frequency of the monitored clock signal is different from a frequency of the reference clock signal.

In some aspects, the techniques described herein relate to a clock monitoring system, wherein the toggle signal is configured to alternate between a high value and a low value at a frequency determined by the evaluation window duration.

In some aspects, the techniques described herein relate to a clock monitoring system, wherein the evaluation window duration is determined by the frequency of the monitored clock signal.

In some aspects, the techniques described herein relate to a clock monitoring system, wherein the clock signal detector includes a first latch, a data input of the first latch is configured to receive the toggle signal, and a clock input of the first latch is configured to receive the monitored clock signal.

In some aspects, the techniques described herein relate to a clock monitoring system, wherein the integrated circuit is an automotive microcontroller.

In some aspects, the techniques described herein relate to a method, including: receiving a reference clock signal; generating a toggle signal using the reference clock signal; generating a clock detector output signal equal to the toggle signal when a monitored clock signal is received; comparing the clock detector output signal to the toggle signal; and when the clock detector output signal is not equal to toggle signal, generating an output signal indicative of a loss of clock signal condition.

In some aspects, the techniques described herein relate to a method, further including: receiving an evaluation window duration; and causing the toggle signal to alternate between a high value and a low value at a frequency determined by the evaluation window duration.

In some aspects, the techniques described herein relate to a method, further including determining the evaluation window duration using a frequency of the monitored clock signal.

In some aspects, the techniques described herein relate to a method, further including: receiving the toggle signal at a data input of a first latch; and receiving the monitored clock signal at a clock input of the first latch.

In some aspects, the techniques described herein relate to a method, wherein receive the monitored clock signal includes receiving a clock signal from a clock divider network.

As will be appreciated by one skilled in the art, aspects of the present disclosure may be embodied as a system, process, method, and/or program product. The block diagrams in the figures illustrate architecture, functionality, and operation of possible implementations of circuitry, systems, methods, processes, and program products according to various embodiments of the present disclosure. In this regard, certain blocks in the block diagrams may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module, and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

It will also be noted that each block of the block diagrams, and combinations of blocks in the block diagrams, can be implemented by special purpose hardware-based systems that perform the specified functions or acts, or combinations of special purpose hardware and computer instructions.

Computer program code, i.e., instructions, for carrying out operations for aspects of the present disclosure may be written in any combination of one or more programming languages, including an object-oriented programming language such as Java, Smalltalk, Python, C++, or the like, conventional procedural programming languages, such as the "C" programming language or similar programming languages, or any of the machine learning software disclosed herein. These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The preceding detailed description is merely illustrative in nature and is not intended to limit the embodiments of the subject matter or the application and uses of such embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

We claim:

1. An integrated circuit, comprising:

logic circuitry configured to perform a function within the integrated circuit;

a monitored clock source configured to provide a monitored clock signal to the logic circuitry, wherein the monitored clock source is predetermined to output the monitored clock signal at a specified operating frequency;

a reference clock source configured to generate a reference clock signal; and a clock monitoring system, comprising:

a toggle signal generator configured to generate a toggle signal using the reference clock signal, wherein the toggle signal toggles to a first value which is maintained to an end of an evaluation window duration defined by a plurality of reference clock cycles of the reference clock signal and toggles to a second value which is maintained during a next evaluation window, a clock signal detector coupled to the toggle signal generator and the monitored clock source, wherein the clock signal detector is configured to generate an output signal equal to the toggle signal when the monitored clock signal is present at an input to the clock signal detector, wherein the output signal is generated in response to one edge of the monitored signal being in the evaluation window duration; and a loss of clock detector coupled to the toggle signal generator and the clock signal detector, wherein the loss of clock detector is configured to:

compare the output signal of the clock signal detector to the toggle signal; and when the output signal of the clock signal detector is not equal to the toggle signal, generate an output signal indicative of a loss of clock signal condition.

2. The integrated circuit of claim 1, wherein the monitored clock source includes a clock divider network.

3. The integrated circuit of claim 2, wherein a frequency of the monitored clock signal is different from a frequency of the reference clock signal.

4. The integrated circuit of claim 3, wherein the clock monitoring system includes a memory storing a value of the evaluation window duration, and the toggle signal is configured to alternate between a high value and a low value at a frequency determined by the evaluation window duration.

5. The integrated circuit of claim 4, wherein the evaluation window duration is determined by the frequency of the monitored clock signal.

6. The integrated circuit of claim 4, further comprising a plurality of clock signal detectors coupled to processors, wherein the loss of clock detector is configured to receive signals from the plurality of clock signal detectors to detect a loss-of-clock conditions in at least one of the processors within a single evaluation window duration and wherein the integrated circuit does not include a plurality of a plurality of clock monitoring units that each require two or more evaluation window durations to detect a clock signal fault.

7. The integrated circuit of claim 1, wherein the toggle signal generator and the loss of clock detector are implemented within a clock monitoring unit (CMU) and the clock signal detector is external to and is not implemented within the CMU.

8. The integrated circuit of claim 1, wherein the clock signal detector includes a first latch, a data input of the first latch is configured to receive the toggle signal, and a clock input of the first latch is configured to receive the monitored clock signal.

9. A clock monitoring system, comprising:

a first input configured to receive a monitored clock signal;

a window duration memory unit configured to store a value determining an evaluation window duration;

a second input configured to receive a reference clock signal;

a toggle signal generator configured to use the evaluation window duration to generate a toggle signal using the reference clock signal, wherein the toggle signal toggles to a first value which is maintained to an end of the evaluation window duration defined by a plurality of reference clock cycles of the reference clock signal and toggles to a second value which is maintained during a next evaluation window, a clock signal detector coupled to the toggle signal generator and configured to receive the monitored clock signal, wherein the clock signal detector is configured to generate an output signal equal to the toggle signal when the monitored clock signal is present at an input to the clock signal detector wherein the output signal is generated in response to one edge of the monitored signal being in the evaluation window duration; and a loss of clock detector coupled to the toggle signal generator and the clock signal detector, wherein the loss of clock detector is configured to:

compare the output signal of the clock signal detector to the toggle signal; and when the output signal of the clock signal detector is not equal to toggle signal, generate an output signal indicative of a loss of clock signal condition.

10. The clock monitoring system of claim 9, wherein the monitored clock signal is received from a clock divider network.

11. The clock monitoring system of claim 10, wherein a frequency of the monitored clock signal is different from a frequency of the reference clock signal.

12. The clock monitoring system of claim 11, wherein the toggle signal is configured to alternate between a high value and a low value at a frequency determined by the evaluation window duration.

13. The clock monitoring system of claim 12, wherein the evaluation window duration is determined by the frequency of the monitored clock signal.

14. The clock monitoring system of claim 9, wherein the clock signal detector includes a first latch, a data input of the first latch is configured to receive the toggle signal, and a clock input of the first latch is configured to receive the monitored clock signal.

15. The clock monitoring system of claim 9, wherein the clock monitoring system is incorporated into an automotive microcontroller.

16. A method, comprising:

receiving a reference clock signal;

generating a toggle signal using the reference clock signal, wherein the toggle signal toggles to a first value which is maintained to an end of an evaluation window duration defined by a plurality of reference clock cycles of the reference clock signal and toggles to a second value which is maintained during a next evaluation window;

generating a clock detector output signal equal to the toggle signal when a monitored clock signal is received, wherein the clock detector output signal is generated in response to one edge of the monitored signal being in the evaluation window duration;

comparing the clock detector output signal to the toggle signal; and when the clock detector output signal is not equal to the toggle signal, generating an output signal indicative of a loss of clock signal condition.

17. The method of claim 16, further comprising:

receiving an evaluation window duration; and causing the toggle signal to alternate between a high value and a low value at a frequency determined by the evaluation window duration.

18. The method of claim 17, further comprising determining the evaluation window duration using a frequency of the monitored clock signal.

19. The method of claim 16, further comprising:

receiving the toggle signal at a data input of a first latch; and receiving the monitored clock signal at a clock input of the first latch.

20. The method of claim 16, wherein receive the monitored clock signal includes receiving a clock signal from a clock divider network.

* * * * *